United States Patent [19]

Sloop, Sr.

[11] Patent Number: 4,747,016
[45] Date of Patent: May 24, 1988

[54] TAMPER-RESISTANT REMOVABLE COVER FOR A UTILITY BOX ASSEMBLY

[76] Inventor: Clifford E. Sloop, Sr., P.O. Box 1574, Columbus, Ga. 31902

[21] Appl. No.: 803,130
[22] Filed: Nov. 29, 1985
[51] Int. Cl.⁴ .............................................. H02B 9/00
[52] U.S. Cl. ..................................... 361/364; 174/50; 324/110; 324/156; 361/369
[58] Field of Search .................. 73/431; 174/50, 50.51; 324/110, 156; 361/331, 364–365, 369, 370; 220/324, 325

[56] References Cited
U.S. PATENT DOCUMENTS 3,683,102 8/1972 Moran et al. ........................ 361/364
4,404,521 9/1983 Fennell ................................ 361/369

Primary Examiner—A. D. Pellinen
Assistant Examiner—Gregory D. Thompson
Attorney, Agent, or Firm—Newton, Hopkins & Ormsby

[57] ABSTRACT

A tamper-resistant removable cover for a utility meter box assembly is disclosed, having a plate member with depending flange portions which engage the securing flange or ring normally used to secure a translucent cover over the viewing window or socket of the meter box. The cover provides a high degree of security for meter boxes, reducing theft of services and/or vandalism that is encountered with conventional methods of securing such boxes. The present cover may use the existing securing device or devices on the box or may be provided with fasteners to engage a portion of the box.

8 Claims, 2 Drawing Sheets

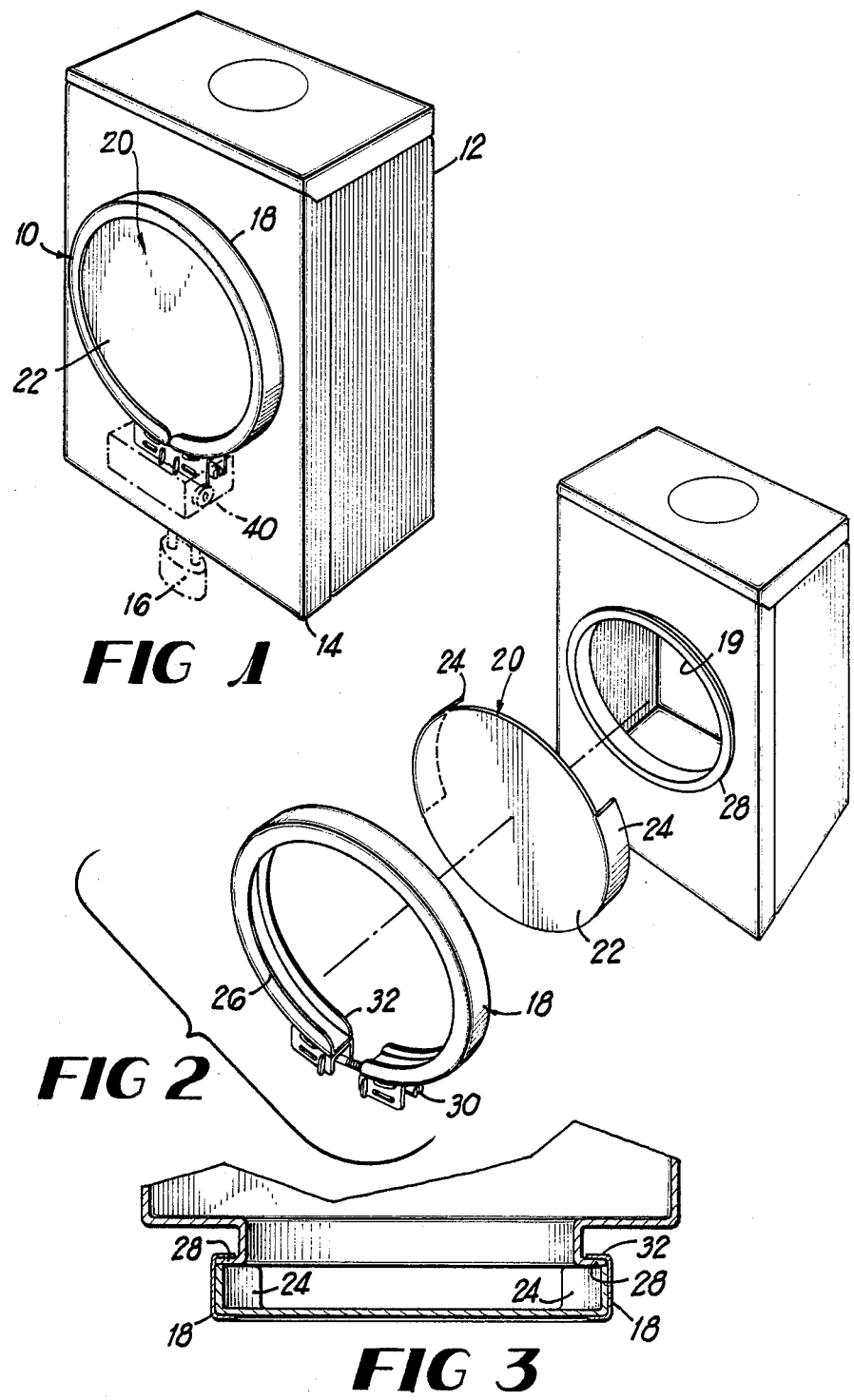

TAMPER-RESISTANT REMOVABLE COVER FOR A UTILITY BOX ASSEMBLY

BACKGROUND OF THE INVENTION

Utility meter boxes are supplied by the utility companies to their customers and are somewhat standardized in type and appearance. The boxes have a common purpose, that of metering electrical or other usage to determine what is owed to a utility company for the service. When a meter is installed, it is common practice for the installer to attach a locking wire clip or similar device at the latch portion of the meter, which can only be removed by essentially destroying the clip or device. This serves as an indicator for the utility company to determine whether a meter may have been tampered with. A typical indicator is a thin copper wire with a lead clasp. The meter box is closed and the wire is threaded through the latch, whereupon the lead clasp is clamped down on the wire with a plier-like device which stamps the installer's code number in the soft lead. Such a device is little deterrent to a potential tamperer.

Most meter boxes are supplied in one of two general embodiments, those with locking rings securing a translucent globe or cover over the viewing window, or those with a translucent cover that is secured over the viewing window by a rim formed in the door of the meter. The translucent covers, normally of glass or plastic, are subject to breakage by thieves or vandals, and thus, present a troublesome security problem.

The theft of services from utility companies is an especially widespread problem. Customers who do not pay for the electrical or other services and have their meter disconnected often break into the meter and reconnect the line. Another common problem involves theft of services by those who break into and adjust their meter downwardly to reflect a lower than actual usage. The utility companies have developed many different devices and methods to try to prevent such occurrences; however, those stealing the service have been equally as inventive.

Since the meters must be accessible to servicemen and other utility company employees in case of problems or breakdown of the meter, they can be opened. Consequently, unauthorized persons have also been able to bypass or defeat current security devices.

This also presents safety problems. For example, the main power lines running into an electrical meter box normally carry relatively high amperage current which is then divided into the multiple lower-amperage circuits which extend throughout the structure. Thus, unauthorized entrants risk severe injury from electrical shock due to lack of safety knowledge and procedures.

SUMMARY OF THE INVENTION

It is, therefore, one of the principal objects of the present invention to provide a tamper-resistant removable cover for utility meter boxes that effectively hinders unauthorized access to the box but is easily installed or removed by authorized personnel.

Another object of the present invention is to provide a removable meter box cover that is inexpensive to produce and install and which is durable to provide a long service life.

A further object of the present invention is to provide a removable meter box cover that is accepted by most types of meter boxes currently in use and which provides much greater security and safety than any current protective devices.

These and additional objects are attained by the present invention, which relates to a tamper-resistant removable cover for utility meter boxes comprising a plate member of a size to completely cover the viewing window of the meter box when the translucent cover has been removed, and attaching means for securing the plate member to the meter box using the box's existing structure.

The invention is designed to replace the normal closure means, i.e., the translucent cover, when utility service is disconnected, and can be made from any suitable tamper-resistant material, such as steel or a dense plastic. The opening in the box normally covered by the translucent cover, and generally known as the socket, is thus effectively secured. Two embodiments of the invention are presented herein, the covers being designed for acceptance by most types of meter boxes currently in use. The present covers prevent access to the box by unauthorized persons and in addition, provide protection against vandalism.

Various additional objects and advantages of the present invention will become apparent from the below description, with reference to the accompanying drawings.

BRIEF DESCRIPTION OF THE DRAWINGS

FIG. 1 is a perspective view of a meter box with the present removable cover installed thereon;

FIG. 2 is an exploded, perspective view of the present cover projected from the installed position;

FIG. 3 is a partial top plan view, shown partially in cross section, with the present cover in installed position;

DETAILED DESCRIPTION OF THE PREFERRED EMBODIMENT

Figure 4:
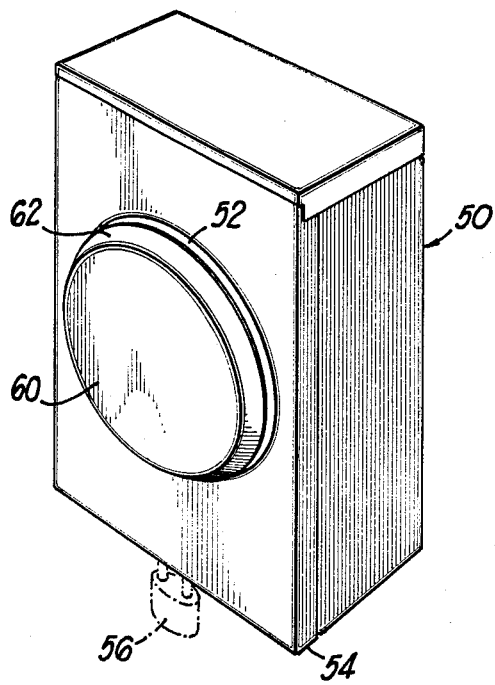
FIG. 4 is a perspective view of an alternate embodiment of the present invention, shown in installed position on a meter box.

Referring now more specifically to the drawings, and to FIG. 1 in particular, numeral 10 designates generally a tamper-resistant, removable cover for utility meter box assemblies. The meter box 12 is of conventional type, having an access door 14 that is normally hinged at the upper edge thereof, and having a latch assembly at the bottom edge thereof, which can be secured with a lock, such as the padlock 16 shown in phantom lines.

This type of meter box normally has a translucent closure means or globe-type cover, (not shown) fastened by securing means such as a locking ring 18. The closure means is disposed over the viewing window or socket 19, and shields the meter mechanism and the electrical or other connections therein from the elements, and somewhat from tampering. This glass or plastic cover allows a meter reader to take readings without opening the box. As noted hereinabove, if the meter is disconnected for non-payment of the bill or when a structure is vacated, the translucent cover is normally left in place. This cover can easily be broken by vandals or by one intent upon re-connecting the meter for theft of service from the utility company.

The present invention is installed over the viewing window, in place of the translucent globe, using the locking ring 18. The present tamper-resistant cover, designated generally by numeral 20, has a generally circular plate member 22, with a diameter essentially equal to the inside diameter of the locking ring. The cover has flanges 24, of a size designated to fit snugly between the outer rim 26 of the locking ring, and the outer rim 28 of the viewing window. The flanges project radially from the outer edge of plate member 22 at essentially a ninety degree angle and keep the cover secured within these rims 26 and 28 upon tightening of screw 30. The inner rim 32 of the locking ring is disposed adjacent the inside edge of rim 28 when the assembly is completed, as shown in FIG. 3, thereby securing the ring and cover 20 to the box.

The flanges need only extend a short distance around the circumference of the plate member, as shown in FIG. 2, to effectively secure the cover in place. This provides economies in manufacturing the cover, although a flange extending around the entire circumference could be provided if desired. Similarly, the flanges may be in any position when installed. For example, the flanges are shown disposed at approximately the three o'clock and the nine o'clock position; however, they may be disposed at the twelve o'clock and six o'clock positions or any other intermediate positions. The present cover may also have either side facing outwardly. While the normal position is as shown in FIG. 2 with the flanges projecting inwardly, the cover may be reversed and provides essentially the same degree of security.

With the cover in place on a meter box of the locking ring type, a suitable covering is then used to surround the threaded enclosure which houses securing screw 30. The covering may be of any type which can be locked in place, such as the covering 40 shown in FIG. 1.

Figure 5:
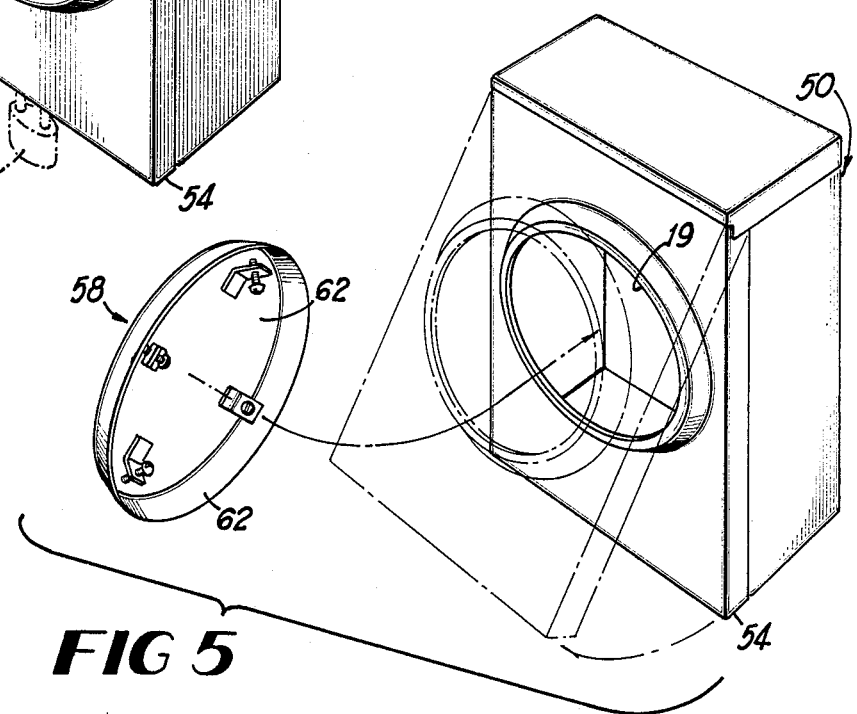
FIG. 5 is an exploded perspective view of the cover shown in the preceding figure, here projected from its installed position.
Figure 6:
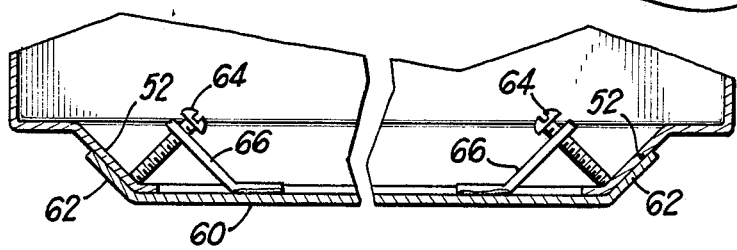
FIG. 6 is a partial top plan view, shown partially in cross section, with the alternate embodiment in installed position.

An alternate embodiment of the present invention is shown in FIGS. 4 through 6. This embodiment serves the same purpose as the prior embodiment but is designed for a meter box 50, which does not have a locking ring. In this type of box, the edge of the translucent globe (not shown) which usually covers the viewing window is normally disposed in a channel (not shown), or a similar structure, which is formed inside the box. The globe is held in place by the securing means or beveled rim 52, formed in the door 54 of the box. The box is normally sealed with a conventional latch mechanism which is secured with suitable lock, such as padlock 56.

As with the arrangement described above, the translucent cover is subject to breakage from thieves or vandals, thus the tamper-resistant, removable cover 58 is installed in place of the normal cover when the meter is disconnected. The cover 58 has a generally circular plate member 60 with a flange means 62 extending radially therefrom. The flange 62 is angled or beveled to engage the oppositely beveled rim 52, which is formed in the door of the box, as shown in FIG. 6.

Disposed on the inner surface of cover 58 are a plurality of suitable securing means, such as screws 64. The screws are disposed in strut means 66 which are secured to the inner surface of plate member 60. The struts are angled to orient the screws against the inner edge of rim 52.

To install cover 58, the door of the box is opened and with the screws backed out, the cover is placed over the viewing window. The screws are then tightened against the inner edge of rim 52 to secure the cover in place. The door can then be closed and locked, thereby effectively securing the box against tampering.

While an embodiment of a tamper-resistant removable cover for utility meter boxes and a modification thereof have been shown and described in detail herein, various additional changes and modifications may be made without departing from the scope of the present invention.

I claim:

1. A tamper-resistant removable cover installed over the socket portion of a door of a utility meter box assembly, said box assembly having existing securing means for attaching conventional closure means over said socket portion, said cover comprising a plate member of sufficient dimension to cover said socket portion, thereby replacing said conventional closure means, and flange means disposed at intervals and depending from the outer edge of said plate member engaging the securing means and fastening said cover over said socket portion.

2. A cover as defined in claim 1 in which said plate member is generally flat and circular and said flange means includes a plurality of flange portions projecting angularly and disposed at intervals around the circumference of said plate member.

3. A cover as defined in claim 2 in which said flange portions project perpendicularly from said plate member.

4. A cover as defined in claim 1 in which said plate member is generally flat and circular and said flange means project perpendicularly from said plate member.

5. A tamper-resistant removable cover installed over the socket portion of a door of a utility meter box assembly, said box assembly having existing securing means for attaching conventional closure means over the socket portion, said cover comprising a plate member covering the socket portion, said plate member having continuous flange means depending at an angle from the outer edge of said plate member engaging said existing securing means and including fastening means mounted on said plate member engaging said existing securing means and attaching said plate member thereto.

6. A cover as defined in claim 5 in which said plate member is generally flat and circular and said flange means extends continuously around the circumference of said plate member.

7. A cover as defined in claim 5 in which said fastening means includes a plurality of screws disposed in struts and mounted at selected intervals near the outer edge of said plate member engaging the securing means on said box.

8. A tamper resistant removable cover installed over the socket portion of a utility meter box assembly, said box having existing securing means for attaching conventional closure means over the socket portion, said cover comprising a generally circular plate member covering the socket portion, said plate member having flange means depending from the outer circumferential edge of said plate member engaging said existing securing means, strut means mounted on said tamper-resistant removable cover at intervals near the outer edge of said removable cover with fastening means disposed in said strut means engaging said existing securing means on said box.

* * * * *